Figure 1:
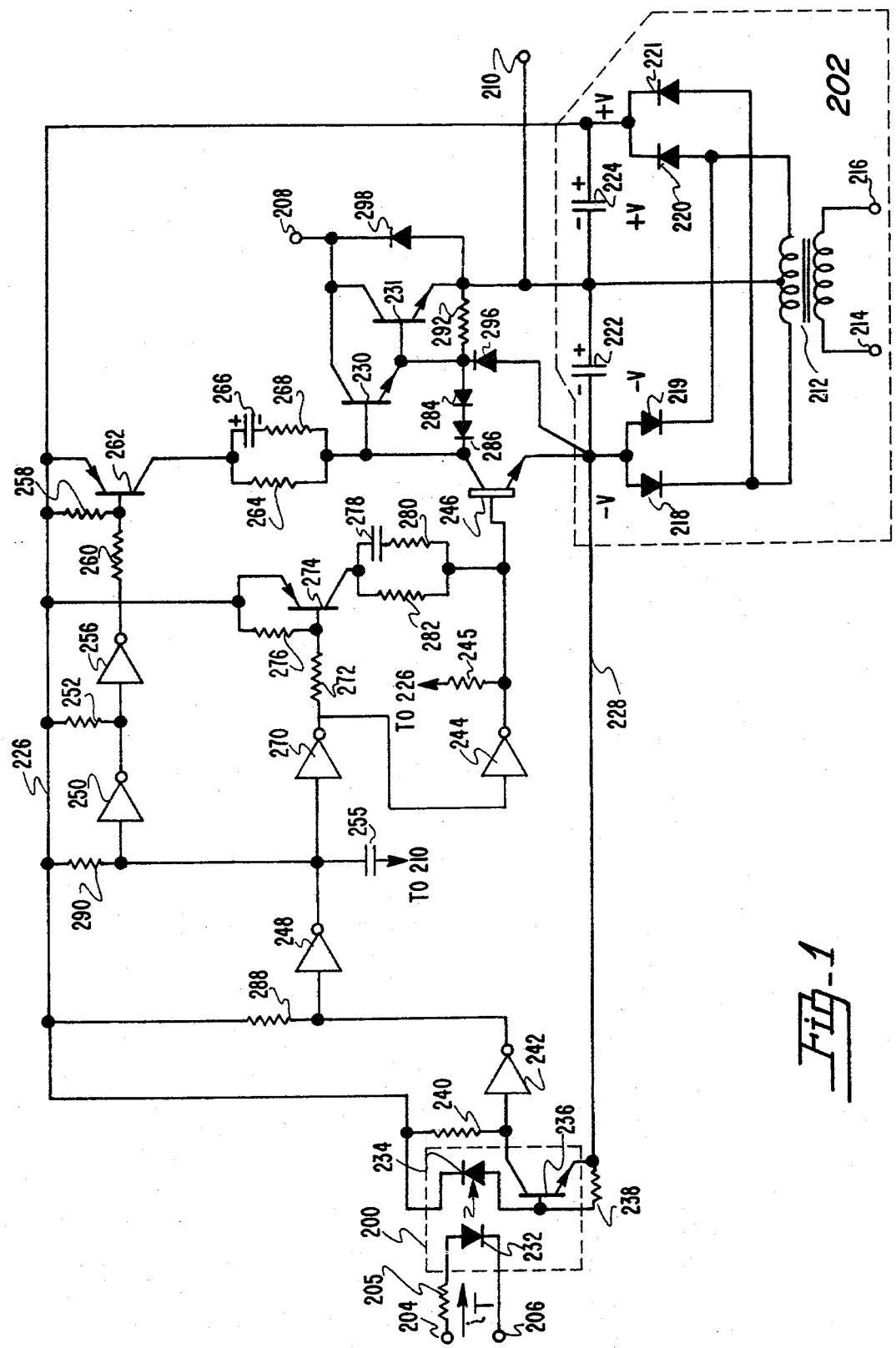

United States Patent [19]

Baker

[11] 4,236,089

[45] Nov. 25, 1980

[54] FLOATING POWER SWITCH

[75] Inventor: Richard H. Baker, Bedford, Mass.

[73] Assignee: Exxon Research & Engineering Co., Florham Park, N.J.

[21] Appl. No.: 944,632

[22] Filed: Sep. 21, 1978

[51] Int. Cl.² .......................................... H03K 17/00
[52] U.S. Cl. .................................. 307/254; 307/255; 307/311; 307/315
[58] Field of Search ................. 307/254, 255, 315, 311

[56] References Cited

U.S. PATENT DOCUMENTS

| | | | |
|---|---|---|---|
| 2,767,365 | 10/1956 | Guggi | 307/315 |
| 3,766,409 | 10/1973 | Shuey | 307/311 |
| 4,021,683 | 5/1977 | Splatt | 307/311 |
| 4,027,228 | 5/1977 | Collins | 307/311 |

*Primary Examiner*—Stanley D. Miller, Jr.
*Assistant Examiner*—B. P. Davis
*Attorney, Agent, or Firm*—Kenneth Watov

[57] ABSTRACT

A floating transistorized switching circuit comprises an optical coupler for electrically isolating a source of control signals from the switching circuit; a floating DC voltage supply, electrically isolated from the AC power line, for providing positive and negative logic level operating voltages, referenced to whatever voltage appears at the output terminal of the switching circuit; an output stage including first and second NPN switching transistors connected in a Darlington configuration; and a logic network responsive to the output signal from the optical coupler going on for turning on the Darlington output stage, and to this output signal going off for turning off the Darlington output stage.

20 Claims, 2 Drawing Figures

FLOATING POWER SWITCH

The field of the present invention relates generally to transistorized switching circuits, and more specifically to such switching circuits applicable for use in multistage cascoded configurations.

Applicant developed this switching circuit specifically to overcome the problems in the prior art in obtaining reliable operation of switching circuits having more than two transistors connected in cascode, for switching relatively high levels of voltage. The present switching circuit provides a single-pole-single-throw switching function, and includes an optical coupler for electrically isolating the switching circuit from a source of control signals, such as a microprocessor, for example, permitting the output voltage from the switching circuit to float up and down independently of the control signal voltage. A floating DC voltage supply provides logic level operating voltages to a logic network, whereby this supply is referenced to whatever voltage appears at the output terminal of the switching circuit, permitting the present switching circuit to be cascoded with a plurality of other like switching circuits, for sequentially switching between relatively high and low levels of voltage, while maintaining the correct levels of operating voltage for each one of the individual switching circuits.

Figure 2:
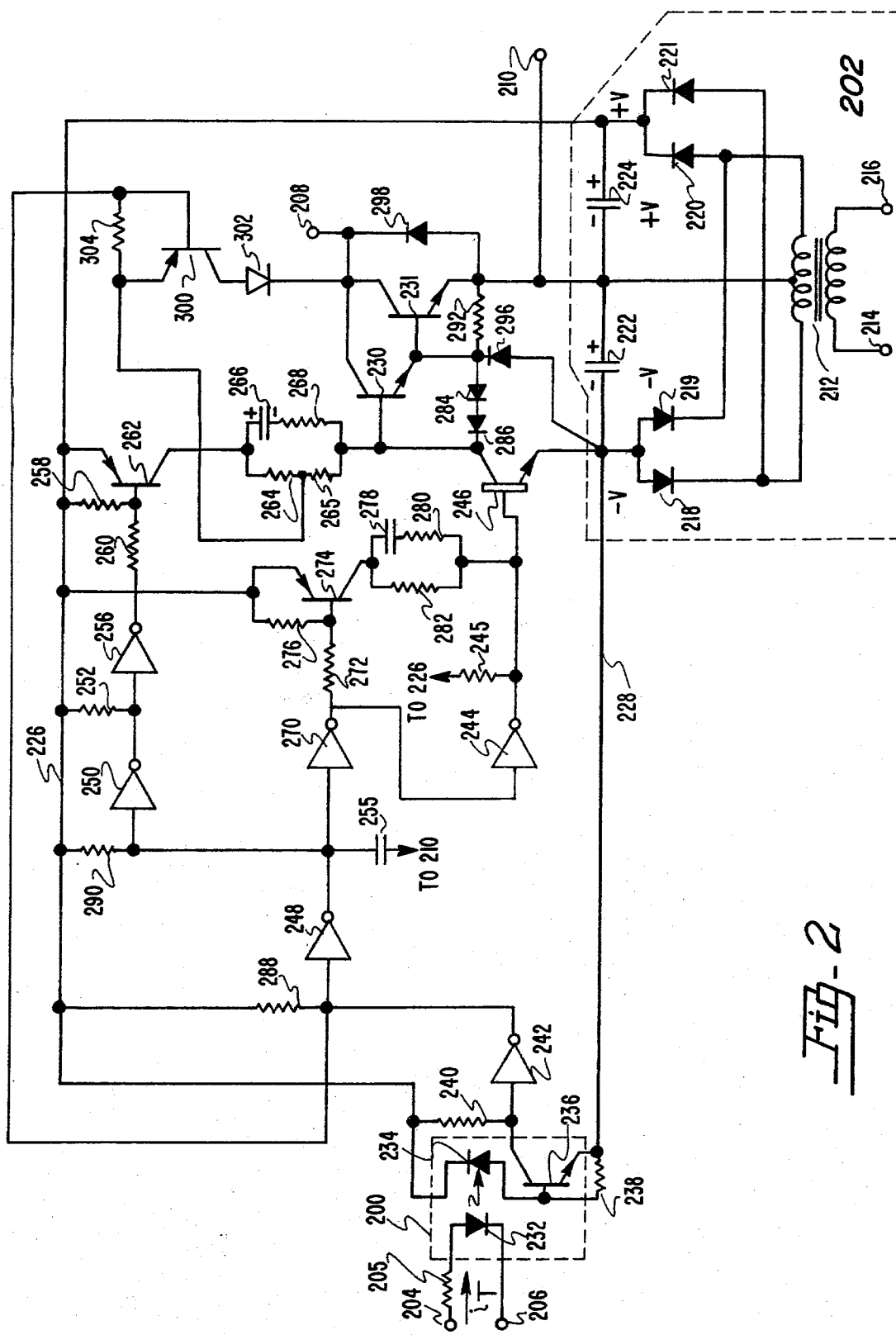

In the drawing, where like items are indicated by the same reference designation:

FIG. 1 is a circuit schematic diagram of a first embodiment of the invention; and FIG. 2 is a circuit schematic diagram of a second embodiment of the invention.

Important features of a first embodiment of the invention shown in FIG. 1 include the optical coupler 200 and local power supply 202. The optical coupler 200 electrically isolates the switching circuit from the source of control signals connected between input terminals 204, 206, permitting the levels of voltage at the power terminals 208 and 210 to float up and down independently of the voltage applied across the input terminals 204, 206. The local supply 202 includes a transformer 212, which serves both to isolate the source of AC voltage applied between terminals 214 and 216 from other portions of the switching circuit, and to provide via a secondary winding a predetermined level of AC voltage for driving the full-wave bridge rectifier of diodes 218-221. The center tap of the secondary winding of the transformer 212 is connected in common to power terminal 210 and filter capacitors 222 and 224, thereby referencing the DC operating voltages +V and −V to whatever voltage is applied to the power terminal 210. These operating voltages +V and −V are applied to operating voltage rails or buses 226, 228, respectively. Referencing of the operating voltages +V and −V to the voltage applied to power terminal 210 ensures that the operating voltage levels will remain at the proper operating levels relative to the voltage at power terminal 210, thereby permitting the switching circuit to be included at any position within a cascoded chain or string of such switching circuits, for sequentially switching between low and high levels of voltage. Such cascoded chains of switching circuits are shown in my copending application Ser. No. 944,634, filed on Sept. 21, 1978, for "High-Voltage Converter Circuit". Note that either power terminal 208 or terminal 210 can be considered as an output terminal.

Operation of the circuit of FIG. 1 will now be described. Assume that the switching circuit is turned off, in which condition no current $i_t$ is flowing through resistor 205 and the Darlington circuit 230, 231 is turned off, thereby causing a substantially high impedance to exist between power or output terminals 208 and 210. This is analogous to an open single-pole-single-throw switch having contacts represented by terminals 208 and 210. To turn on the switching circuit, a control signal is applied between input terminals 204 and 206, (voltage at 204 is more positive than voltage at 206) and this causes a current $i_T$ to flow as shown through the current limiting resistor 205, and the light-emitting diode 232 of the optical coupler 200. In response to this flow of current, diode 232 emits infrared radiation which is detected by the photodiode 234. The photodiode 234 responds to this light by substantially lowering its impedance, thereby permitting current to flow from voltage rail 226 (the +V voltage side of local supply 202) into the base electrode of transistor 236 of the optical coupler 200, and through the resistor 238 to the −V operating voltage rail 228, causing transistor 236 to turn on. When transistor 236 so turns on, current flows from the positive voltage rail 226, through resistor 240 and the collector-emitter current path of transistor 236 to the negative voltage rail 228, in turn causing the level of voltage at the input terminal of inverter 242 to decrease in potential from substantially +V and −V volts. In response to this drop in voltage at its input terminal, inverter 242 changes the level of the voltage at its output terminal from a relatively low level to a relatively high level. Inverter 248, changes the condition of its output signal from a relatively high level (about +V volts) to a relatively low level (about −V volts), in response to the change in the level of the output signal from inverter 242. When the output signal from inverter 248 goes low, inverter 270 responds thereto by changing the level of its output signal from "low" to "high", turning off transistor 274. Inverter 244 changes the condition of the level of its output signal from a relatively high level to a relatively low level in response to the change in the level of the output signal from inverter 270, thereby "pulling down" the base electrode of Darlington transistor 246, the latter remaining in a saturated state for a short time because of minority charge carrier storage in its base region. Before Darlington transistor 246 becomes unsaturated because of the recombination of minority carriers in the base region, inverter 250 changes the level of its output signal from a low level to a high level, in response to the low level output signal from inverter 248. When the now-positive-going output signal from inverter 250 exceeds the input threshold level of inverter 256, the latter responds by changing the level of its output signal from a high level to a low level, causing current to flow from the positive rail 226 through resistors 258 and 260 into the output terminal of inverter 256, and from the base electrode of transistor 262 through current-limiting resistor 260 into the output terminal of inverter 256. In this manner, transistor 262 is turned on about two microseconds after the change in the output signal of inverter 242 from a low level to a high level. When transistor 262 turns on, substantially +V volts is applied via the emitter-collector current path of transistor 262 (now having a substantially low impedance) and the combination of resistor 264 in parallel with the series circuit of capacitor 266 and resistor 268, to the collector electrode of Darlington transistor 246, causing the latter to come out of saturation and turn off. When Darlington transistor 246 comes out of saturation, the large transient current flowing through capacitor 266 and resistor 268 (controls magnitude of current) flows into the base electrode of transistor 230, overdriving the Darlington circuit 230, 231 to cause it to turn on into saturation in a substantially short period of time (transistors 230 and 231 turned on). After the turnon overdrive transient current subsides due to the charging of the speedup capacitor 266, the magnitude of the base current applied to the base electrode of transistor 230 is controlled by the value of resistor 264 for maintaining the Darlington circuit 230, 231 turned on. When the Darlington circuit 230, 231 so turns on, the impedance between the collector and emitter electrodes of transistor 231 is substantially reduced, for connecting power terminal 208 to output terminal 210, permitting current to flow therebetween.

When the switching circuit of FIG. 1 is operated as described above for turning on the output Darlington 230, 231, and thereafter it is desired to turn off this Darlington circuit, the input signal applied across terminals 204 and 206 is removed to interrupt the current $i_T$ flowing through the light-emitting diode 232. Next, in sequential order, the impedance of photodiode 234 substantially increases, preventing the flow of base current for transistor 236, causing transistor 236 to turn off. When transistor 236 turns off, the voltage at its collector electrode rises toward the positive rail 226, causing about +V volts to be applied to the input terminal of inverter 242, the latter responding by changing the level of its output signal from a high level to a low level, the inverter 248 responds thereto by changing the level of its output signal from a low level to a high level, this change taking place in a time period determined by timing circuit 290, 255. When the output signal from inverter 248 goes high, inverters 270 and 244 respond thereto by changing the level of their respective output signals. Inverter 270 output changes from a high level to a low level, permitting current to flow from the positive rail 226 through the resistors 276 and 272 into the output terminal of inverter 270. Also, base current flows from the transistor 274 through resistor 272 into the output terminal of inverter 270, thereby turning on transistor 274, causing a large transient current to flow from the positive rail 226 through the collector-emitter current path of transistor 274, and substantially through the speedup circuit of capacitor 278 and resistors 280 and 282, into the base electrode of Darlington transistor 246, thereby providing fast turnon of this Darlington transistor. The time constant of the speedup circuit 278, 280, 282 is such that shortly after the Darlington transistor 246 turns on, capacitor 278 charges, and the sustaining current for keeping on the Darlington transistor 246 is provided from the positive rail 226 via resistor 282 and the collector-emitter current path of transistor 274. The hard turnon of Darlington transistor 246 overrides the static "on current" flowing from resistor 264 into the base electrode of transistor 230, and causes a large current to flow out of the bases of transistors 230 and 231, with the base current from transistor 231 flowing into the collector electrode of Darlington transistor 246 via the current path provided by diodes 284 and 286. This causes the output Darlington 230, 231 to go out of saturation and rapidly turn off with correspondingly low turnoff power dissipation. Note that at about the same time that inverter 270 changes state, inverter 250 changes its output signal from a high level to a low level in response to the high level output signal from inverter 248. Inverter 256 changes the level of its output signal from a low level to a high level, in response to the change in level of the output signal from inverter 250, thereby turning off transistor 262. Also note that resistors 240, 288, 290 and 252 serve as "pull-up" resistors for inverters 242, 248, 250 and 256, respectively; that in relatively low power applications, the pull-up resistor 245 shown in phantom connection, can be substituted for the switching circuit consisting of transistor 274, resistor 280, 282, and capacitor 278; that resistor 292 serves as a biasing resistor; and that diode 296 permits the collector-base junctions of transistors 230 and 231 to be discharged when the $V_{CE}$ across these transistors drops from a high positive to a relatively low positive value. The antiparallel diode 298 across Darlington circuit 230, 231 is included to provide bilateral current flow for the Darlington switching circuit 230, 231, whereby when the switching circuit turns off current can flow from reactive loads connected to output terminal 210, through diode 298, and into power terminal 208. To connect a plurality of switching circuits identical to FIG. 1 in cascode, the terminal 208 of a first individual circuit is connected to the terminal 210 of a second individual circuit, and the terminal 210 of the first individual circuit is connected to the terminal 208 of a third individual circuit, and so forth.

In FIG. 2, a second embodiment of the invention is shown, including four elements in addition to the elements of the circuit of FIG. 1. These additional elements include a resistor 265 connected in a voltage divider configuration with resistor 264, a PNP transistor 300, a diode 302, and a bias resistor 304. These additional elements form a gated feedback circuit around Darlington amplifier 230, 231, for causing the latter to come out of saturation a short time before Darlington transistor 246 turns on, permitting faster turnoff of the Darlington amplifier 230, 231, as will be described. A more detailed description than described herein of the operation of this gated feedback or gated back-clamped arrangement, is given in my copending application Ser. No. 944,562, filed on Sept. 21, 1978, for "Gated Back-Clamped Transistor Switching Circuit". The circuit of FIG. 2 operates substantially identically to that of FIG. 1, except that during the turnoff cycle for Darlington amplifier 230, 231, as soon as the output signal from inverter 242 goes "low", PNP transistor 300 responds by supplying base current into the output impedance of inverter 242, causing transistor 300 to turn on. When transistor 300 so turns on, the impedance between its collector and emitter electrodes is substantially decreased, permitting current to flow from the common connections between resistors 264, 265, through the collector-emitter electrode current path of transistor 300, and through diode 302 into the commonly connected collector electrodes of transistors 230, 231, thereby diverting base current away from transistor 230, causing the Darlington amplifier 230, 231 to come out of saturation. This occurs before the output signal from inverter 270 goes low, because of the time delay provided by the timing circuit 290, 255. As soon as the output signal from inverter 270 goes low, inverter 244 responds by changing its output signal from a low to a high level, at about the same time the transistor 274 turns on in response to the change in output level from inverter 270, causing NPN Darlington transistor 246 to turnon, for turning off the Darlington amplifier 230, 231, as previously described. Since the Darlington amplifier 230, 231 is in an unsaturated state at this time, it turns off much faster than from a saturated state, as in the first embodiment of the invention.

Note that in the first and second embodiments of the invention of FIGS. 1 and 2, respectively, that the optical coupler 200, and the logic network including inverters 242, 244, 248, 250, 256, and 270, and inverting transistor circuits including transistors 262, 274, and 246, are all provided logic level operating voltages from the local supply 202. For the sake of simplicity, the power connections to the logic inverters are not shown. Accordingly, relatively low power and inexpensive digital inverters and transistors can be used in the logic network for operating the relatively high power output stage transistors 230, 231.

What is claimed is:

1. A floating transistorized switching circuit comprising:
   first and second operating voltage terminals for receiving positive and negative polarity logic level voltages;
   a power terminal;
   an output terminal;
   means for electrically isolating a source of control signals from the switching circuit, having an input terminal for receiving control signals, and a control signal output terminal electrically isolated from its input terminal, the control signals being reproduced at this control signal output terminal;
   floating DC voltage supply means connected between said first and second terminals for providing said positive and negative polarity logic level voltages thereto, respectively, said floating supply means having a reference terminal connected to said output terminal for referencing said logic level voltages to whatever voltage appears at said output terminal;
   an output stage having a main current conduction path connected between said power and output terminals, and a control terminal for receiving a logic signal, said output stage being responsive to said logic signal having a first level for substantially lowering the impedance of its main current path, and to said logic signal having a second level for substantially increasing the impedance of its main current conduction path; and
   logic network means connected between said first and second terminals having an input terminal connected to the control signal output terminal of said isolating means, and an output terminal connected to the control terminal of said output stage, said logic network means being responsive to said control signals going "high" and "low" for producing at its output terminal the first and second levels of said logic signal, respectively, for turning on and off said output stage.

2. The floating transistorized switching circuit of claim 1, wherein said isolating means consists of an optical coupler.

3. The floating transistorized switching circuit of claim 1, or 2, wherein said floating DC voltage supply means, includes:
   bridge rectifier means having one pair of arms connected between said first and second terminals, and another pair of arms;
   a transformer having a primary winding for receiving an AC line voltage, and a secondary winding connected across said another arm of said rectifier means, said secondary winding having a centertap connected to said reference terminal; and
   a pair of filter capacitors individually connected between said first terminal and said reference terminal, and said second terminal and said reference terminal, respectively.

4. A floating transistorized switching circuit, comprising:
   a first terminal for receiving an operating voltage having a positive polarity;
   a second terminal for receiving an operating voltage having a negative polarity;
   a power terminal for receiving a relatively high level of voltage having a positive polarity;
   an output terminal;
   floating DC voltage supply means for producing said positive and negative operating voltages referenced to the potential at said output terminal at any time;
   first switching amplifier means having a main current conduction path connected between said power and output terminals, and a control electrode receptive of a first logic signal, said first amplifier means being responsive to a "high" level of said first logic signal for substantially lowering the impedance of its main current conduction path, and to a "low" level of said first logic signal for substantially increasing the impedance of its main current conduction path;
   coupling means connected between said first and second terminals, having a pair of input terminals for receiving a control signal, and an output terminal electrically isolated from its pair of input terminals, said coupling means being responsive to "high" and "low" levels of said control signal, for producing "low" and "high" signals, respectively, at its output terminal; and
   logic network means connected between said first and second terminals, having an input terminal connected to the output terminal of said coupling means, and a first output terminal connected to the control electrode of said first amplifier, said logic network means being responsive to a "low" state of the output signal from said coupling means, for producing at its first output terminal said first logic signal having a "high" level, and responsive to a "high" state of the output signal from said coupling means, for producing said first logic signal having a "low" level, for turning on and turning off, respectively, said first switching amplifier means.

5. The floating transistorized switching circuit of claim 4, wherein said first switching amplifier includes:
   first NPN switching transistor means having a base electrode as said control electrode, a collector electrode connected to said power terminal, and an emitter electrode;
   second NPN switching transistor means having a collector electrode connected to said power terminal, an emitter electrode connected to said output terminal, and a base electrode connected to the emitter electrode of said first NPN transistor means;
   a bias resistor connected between the base and emitter electrodes of said second NPN transistor means; and
   first diode means having an anode and cathode electrodes individually connected to the emitter and base electrodes, respectively, of said first NPN transistor means.

6. The floating transistorized switching circuit of claim 5, wherein said first switching amplifier includes second diode means having a cathode electrode connected to the anode electrode of said first diode means, and an anode electrode connected to said second terminal, for permitting the collector-base junctions of each one of said first and second NPN transistor means to be rapidly discharged whenever the voltage across the collector and emitter electrodes of these transistor means drops from a relatively high positive value to a relatively low positive value.

7. The floating transistorized switching circuit of claim 6, further including:
current diverting means connected between the base and collector electrodes of said first NPN transistor means, having a control electrode receptive of a second logic signal, said diverting means being responsive to said second logic signal going "low", for diverting some base current from the base electrode of this transistor means to the collector electrodes of said first and second NPN transistor means, thereby causing these transistor means to operate in an unsaturated condition;
said logic network means further including a second output terminal connected to the control electrode of said current diverting means, and means for producing said second logic signal at said second output terminal, said second logic signal being made "high" for disabling said current diverting means whenever said first logic signal is "high", said second logic signal being made "low" a short time before said first logic signal is made "low", thereby providing faster turnoff of said first and second NPN transistor means.

8. The floating transistorized switching circuit of claim 7, wherein said current diverting means, includes:
first PNP switching transistor means having an emitter electrode coupled to the base electrode of said first NPN switching transistor means, a base electrode connected to said second output terminal of said logic network means, and a collector electrode; and
third diode means having an anode electrode connected to the collector electrode of said first PNP switching transistor means, and a cathode electrode connected to the collector electrodes of said first and second NPN switching transistor means, said first PNP switching transistor means being responsive to said second logic signal going "low", for turning on and substantially connecting said third diode means to the base electrode of said first NPN switching transistor means, for diverting some base current from this base electrode through the collector-emitter current path of said first PNP switching transistor means, through said third diode means, to the collector electrode of said first NPN switching transistor means, said PNP switching transistor means being responsive to said second logic signal going "high", for turning off and substantially disconnecting said third diode means from the base electrode of said first NPN transistor switching transistor means.

9. The floating transistorized switching circuit of claims 5, or 6, or 7, or 8, wherein said first and second NPN switching transistor means each consist of an NPN switching transistor.

10. The floating transistorized switching circuit of claim 4, or 5, or 6, or 7, or 8, wherein said coupling means consists of an optical coupler.

11. The floating transistorized switching circuit of claim 5, or 6, or 7, wherein said logic network means includes:
third NPN switching transistor means having an emitter electrode connected to said second terminal, a collector electrode connected to the first output terminal of said logic network means, and a base electrode; and
first digital inverter means connected between the output terminal of said coupling means and the base electrode of said third NPN switching transistor means, said first inverter means being responsive to a "high" level output signal from said coupling means for driving current into the base electrode of said third NPN switching transistor, causing the latter to turn on for producing the "low" level of said first logic signal at its collector electrode, whereby base current is conducted from the base electrode of said first NPN switching transistor means through the collector-emitter current path of said third NPN switching transistor means to said second terminal, and from the base electrode of said second NPN switching transistor means through the current conduction path of said first diode means and the collector-emitter electrodes of said third NPN switching transistor means to said second terminal, for turning off said first and second NPN switching transistor means, said first inverter means being responsive to a "low" level output signal from said coupling means for interrupting the flow of current into, and drawing current from, the base electrode of said third NPN switching transistor means, thereby initiating the turnoff of the latter.

12. The floating transistorized switching circuit of claim 11, wherein said third NPN switching transistor means consists of an NPN Darlington transistor.

13. The floating transistorized switching circuit of claim 11, wherein said logic network means further includes:
PNP switching transistor means having an emitter electrode connected to said first terminal, a base electrode, and a collector electrode coupled to the first output terminal of said logic network means;
second digital inverter means connected between the output terminal of said coupling means and the base electrode of said PNP switching transistor, said second digital inverter means being responsive to the output signal from said coupling means going "high" for applying a "high" level signal to the base electrode of said PNP switching transistor, for turning off the latter, and being responsive to the output signal from said coupling means going "low" for applying a "low" level signal to the base electrode of said PNP switching transistor means, a short time after said first digital inverter means interrupts the flow of base current into said third NPN switching transistor means, thereby causing said PNP switching transistor means to turn on, substantially lowering the impedance between its emitter and collector electrodes, substantially applying said positive operating voltage to the first output terminal of said logic network means, and permitting current to flow from said first terminal, through the collector-emitter current path of said PNP switching transistor means, into the base electrode of said first NPN switching transistor means, sequentially causing said third NPN switching transistor means to come out of saturation and turn off, and said first and second NPN switching transistor means to turn on.

14. The floating transistorized switching circuit of claim 13, wherein said means for producing said second logic signal includes third digital inverter means connected between the output terminal of said coupling means and said second output terminal of said logic network means, said third digital inverter means acting to directly invert the output signal from said coupling means, and having a faster response time than said first and second digital inverter means.

15. The floating transistorized switching circuit of claim 8, wherein said logic network means includes:
third NPN switching transistor means having an emitter electrode connected to said second terminal, a collector electrode connected to the first output terminal of said logic network means, and a base electrode;
second PNP switching transistor means having an emitter electrode connected to said first terminal, a base electrode, and a collector electrode;
first and second resistors connected in series between the collector electrode of said second PNP switching transistor means and the first output terminal of said logic network means, the common connection between said first and second resistors being connected to the emitter electrode of said first PNP switching transistor means;
first digital inverter means connected between the output terminal of said coupling means and said second output terminal of said logic network means, said first inverter means being responsive to the output signals from said coupling means, for inverting the same and applying this inverted signal as said second logic signal to the second output terminal;
second digital inverter means connected between the second output terminal of said logic network means and the base electrode of said third NPN switching transistor means, responsive to said second output signal going "low", for applying a "high" signal to, and driving current into, the base electrode of said third NPN switching transistor means, a short time after said first inverter means applies a "low" signal to the base of said first PNP switching transistor means, causing said third NPN switching transistor means to turn on a short time after the latter, substantially lowering the impedance between its collector and emitter electrodes, causing said first logic signal to go "low", whereby base current is drawn away from the base electrode of said first NPN switching transistor through the collector-emitter current path of said third NPN switching transistor means to said second terminal, and away from the base electrode of said second NPN switching transistor means through the conduction path of said first diode means and collector-emitter electrodes of said third NPN switching transistor means to said second terminal, thereby turning off said first and second NPN switching transistor means, said second digital inverter means being responsive to said second digital output signal going "high", for applying a "low" signal to the base electrode of said third NPN switching transistor means, thereby initiating the beginning of the turnoff cycle for the latter;
third digital inverter means connected between said second output terminal of said logic network means and the base electrode of said second PNP switching transistor means, responsive to said second logic signal going "low" for applying a "high" level signal to the base electrode of said second PNP switching transistor means, for turning off the latter a short time after said first PNP transistor switching means turns on, said third digital inverter means being responsive to said second logic signal going "high" for applying a "low" level signal to the base of said second PNP switching transistor means, and drawing base current therefrom at about the same time said second inverter means applies a "low" level signal to the base of said third NPN switching transistor means, thereby causing said second PNP switching transistor means to turn on, in turn causing said first logic signal to go "high", pulling said third NPN switching transistor out of saturation, the latter then turning off, in turn causing current to flow from said first terminal through the current conduction path of said collector and emitter electrodes of said second PNP switching transistor means, said first and second resistors, and into the base electrode of said first NPN switching transistor means, causing the latter and said second NPN switching transistor means to turn on into saturation.

16. The floating transistorized switching circuit of claim 15, wherein said logic network means further includes:
a third resistor; and
a speedup capacitor connected in series with said third resistor, this series circuit being connected in parallel with the series circuit of said first and second resistors, for providing a transient overdrive current into the base electrode of said first NPN switching transistor means just after said second PNP switching transistor means is turned on.

17. The floating transistorized switching circuit of claim 4, or 5, or 6, or 7, or 8, wherein said floating DC voltage supply means includes:
full-wave diode bridge rectifier means having one pair of arms connected between said first and second terminals, and another pair of arms;
an AC transformer having a secondary winding connected across said another pair of arms of said rectifier means, and a primary winding for receiving an AC time voltage, said secondary winding having a centertap; and
first and second filter capacitors each connected at one end to the centertap of said secondary winding, and at another end to said first and second terminals, respectively.

18. A floating transistorized switching circuit, comprising:
a first terminal for receiving a positive operating voltage having a relatively low level;
a second terminal for receiving a negative operating voltage having a relatively low level;
a power terminal for receiving a relatively high level of voltage having a positive polarity;
an output terminal;
floating DC voltage supply means for producing said positive operating voltage and said negative operating voltage at predetermined digital logic voltage levels, these positive and negative operating voltages being referenced to the potential at said output terminal at any time;

control signal coupling means having a pair of input terminals for receiving a control signal, and a logic signal terminal electrically isolated from said pair of input terminals, said control signal coupling means being responsive to a "high" level of control signal for producing a first logic signal having a "low" level at its logic signal terminal, and to a "low" level of control signal for producing said first logic signal having a "high" level at its logic signal terminal;

first NPN switching transistor means having a base electrode, a collector electrode connected to said power terminal, and an emitter electrode;

second NPN switching transistor means having a base electrode connected to the emitter electrode of said first NPN switching transistor means, a collector electrode connected to said power terminal, and an emitter electrode connected to said output terminal;

first diode means having an anode electrode connected to the base electrode of said second NPN transistor switching means, and a cathode electrode connected to the base electrode of said first NPN transistor switching means;

second diode means having a cathode electrode connected to the base electrode of said second NPN switching means, and an anode electrode connected to said second terminal;

a first resistor connected between the base and emitter electrodes of said second NPN switching transistor means;

third NPN switching transistor means having a base electrode receptive of a second logic signal, a collector electrode connected to the base electrode of said first NPN switching transistor means, and an emitter electrode connected to said second terminal;

first PNP switching transistor means having a control electrode receptive of a third logic signal, and a main current conduction path connected between the base electrode of said first NPN switching transistor means and said first terminal;

second PNP switching transistor means having a control electrode receptive of a fourth logic signal, and a main current conduction path connected between the base electrode of said third NPN switching transistor means and said first terminal;

first logic network means connected between the logic signal terminal of said coupling means and the base electrode of said third NPN switching transistor means, said first logic means being responsive to said first logic signal having a low level for producing and changing the level of said second logic signal from "high" to "low";

second logic network means connected between the logic signal terminal of said coupling means and the control electrode of said second PNP switching transistor means, said second logic means being responsive to said first logic signal changing a short time after said first logic means from a "high" to a "low" level, for producing and changing said fourth logic signal from a "low" to a "high" level a short time after the change of state of the second logic signal, thereby turning off said second PNP switching transistor means; and third logic network means connected between the logic signal terminal of said coupling means and the control electrode of said first PNP switching transistor means, said third logic means being responsive to the change in level of said first logic signal from "high" to "low", for producing and changing the level of said third logic signal from "high" to "low" a short time after the change of state of the fourth logic signal, thereby turning on said first PNP switching transistor means for applying substantially said positive operating voltage to both the collector electrode of said third NPN switching transistor means, causing the latter to come out of saturation and turn off, and to the base electrode of said first NPN switching transistor means, causing said first and second NPN switching transistor means to each turn on for substantially lowering the impedance between and permitting current to flow from said first power to said output terminal;

thereafter, if said first logic signal goes "high", said first logic means responds thereto by changing the level of said second logic signal to "high", and said second logic means responds a short time later to said first logic signal level change by changing the level of said fourth logic signal to "low", causing said second PNP switching transistor means to turn on for supplying base current to and turning on said third NPN switching transistor means, the latter conducting base current away from said first and second NPN switching transistor means to said second terminal, thereby turning both of the latter off, and a short time thereafter said third logic means responds to the change in level of said first logic signal for changing the level of said third logic signal to "high", causing said first PNP switching transistor means to turn off.

19. The floating transistorized switching circuit of claim 18, further including:

second and third resistors connected in series between the collector electrode of said first PNP switching transistor means and the base electrode of said first NPN switching transistor means;

third PNP switching transistor means having a base electrode, an emitter electrode connected to the common connection of said second and third resistors, and a collector electrode;

diode means having an anode electrode connected to the collector electrode of said third PNP switching transistor means, and a cathode electrode connected to the collector electrode of said first and second NPN switching transistor means; and fourth logic network means connected between the logic signal terminal of said coupling means and the base electrode of said third PNP switching transistor means, said fourth logic means being responsive to said first logic signals going low, for applying a "high" level signal to the base electrode of said third PNP switching transistor means, turning off the latter, substantially raising the impedance between its collector and emitter electrodes, said fourth logic means being responsive to said first logic signal going "high", for applying a "low" level signal to the base electrode of said third PNP switching transistor means for turning on the latter a short time before said first PNP switching transistor means turns off and said third NPN switching transistor means turns on, said third PNP switching transistor means substantially reducing the impedance between its collector and emitter electrodes, permitting current to flow from the common connection of said second and third resistors through the collector-emitter electrodes of said third PNP switching transistor means, and said diode means into the collector electrodes of said first and second NPN switching transistor means, causing the latter two to come out of saturation, thereby reducing the time required to thereafter turn off said first and second NPN switching transistor means.

20. The floating transistorized switching circuit of claim 18, or 19, wherein said control signal coupling means consists of an optical coupler.

* * * * *